United States Patent
Terao

(10) Patent No.: US 7,863,808 B2
(45) Date of Patent: Jan. 4, 2011

(54) RESONANT CAVITY COLOR CONVERSION EL DEVICE AND ORGANIC EL DISPLAY DEVICE USING THE SAME

(75) Inventor: Yutaka Terao, Matsumoto (JP)

(73) Assignee: Fuji Electric Holdings Co., Ltd., Kawasaki (JP)

( * ) Notice: Subject to any disclaimer, the term of this patent is extended or adjusted under 35 U.S.C. 154(b) by 178 days.

(21) Appl. No.: 12/379,001

(22) Filed: Feb. 10, 2009

(65) Prior Publication Data

US 2009/0212696 A1 Aug. 27, 2009

(30) Foreign Application Priority Data

Feb. 27, 2008 (JP) .............................. 2008-046862

(51) Int. Cl.
*H01L 51/50* (2006.01)
*H01L 51/52* (2006.01)

(52) U.S. Cl. ...................... 313/501; 313/503; 313/504; 313/506

(58) Field of Classification Search ......... 313/500–512; 257/72, 98–100
See application file for complete search history.

(56) References Cited

U.S. PATENT DOCUMENTS

| | | | |
|---|---|---|---|
| 2002/0063517 A1* | 5/2002 | Hosokawa | 313/504 |
| 2002/0190639 A1* | 12/2002 | Yamada et al. | 313/504 |
| 2005/0058852 A1* | 3/2005 | Tyan et al. | 313/506 |
| 2005/0233166 A1* | 10/2005 | Ricks et al. | 313/506 |

FOREIGN PATENT DOCUMENTS

| | | |
|---|---|---|
| JP | 03-152897 | 6/1991 |
| JP | 06-283271 | 10/1994 |
| JP | 2838063 | 10/1998 |
| JP | 2002-359076 | 12/2002 |
| JP | 2003-081924 | 3/2003 |
| JP | 2003-212875 | 7/2003 |

(Continued)

OTHER PUBLICATIONS

Greenham et al., "Angular Dependence of the Emission from a Conjugated Polymer Light-Emitting Diode: Implications for Efficiency Calculations", Advanced Materials, vol. 6, pp. 491-494, 1994.
Dodabalapur et al., "Microcavity effects in organic semiconductors", Applied Physics Letters, vol. 64, pp. 2486-2488, May 9, 1994.

(Continued)

*Primary Examiner*—Mariceli Santiago
(74) *Attorney, Agent, or Firm*—Rabin & Berdo, P.C.

(57) ABSTRACT

A resonant cavity color conversion EL element in which intensity of converted light from a color conversion layer is increased and an organic EL display device in which viewing angle dependence of the color tone is small and the manufacturing process is simple. The EL element includes at least a pair of electrodes; a functional layer includes a light-emitting layer and is sandwiched by the pair of electrodes; a color conversion layer that absorbs light emitted from the light-emitting layer and emits light with a different wavelength; and a pair of light reflective layers. Notably, the pair of light reflective layers are composed of a non-transparent reflective layer and a semi-transparent reflective layer that have a distance therebetween that is set at an optical distance to construct a microcavity that increases intensity of light with a specific wavelength emitted from the color conversion layer.

18 Claims, 5 Drawing Sheets

FOREIGN PATENT DOCUMENTS

| | | |
|---|---|---|
| JP | 2003-238516 | 8/2003 |
| JP | 2004-115441 | 4/2004 |
| WO | WO-94/07344 | 3/1994 |
| WO | WO-03/048268 A1 | 6/2003 |

OTHER PUBLICATIONS

Max Born and Emil Wolf, "Principles of Optics" Second Edition, 1964, Pergamon Press.

O.S. Heavens, "Optical Properties of Thin Solid Films", 1991, Dover Publishing Inc.

\* cited by examiner

RESONANT CAVITY COLOR CONVERSION EL DEVICE AND ORGANIC EL DISPLAY DEVICE USING THE SAME

CROSS-REFERENCE TO RELATED APPLICATION

This Application is based on, and claims priority to, Japanese Patent Application No. 2008-046862, filed on Feb. 27, 2008, the contents of which are incorporated herein by reference.

BACKGROUND OF THE INVENTION

1. Field of the Invention

The present invention relates to a multicolor light-emitting electroluminescent device. A multicolor light-emitting electroluminescent device according to the invention can be used in appliances such as personal computers, word processors, TV sets, facsimiles, audio sets, video devices, car navigation devices, electronic calculators, telephones, portable terminals, and industrial instruments.

2. Description of the Related Art

With needs for diversity and space saving in information devices, extensive development efforts for flat panel displays that attain lower power consumption and smaller occupied space than CRTs have been in progress. In particular, expectations for electroluminescent (EL) displays are rising because of their self-emitting feature and capability of high definition.

For EL devices, numerous studies have been made that focus on improving light emission efficiency and energy conversion efficiency. It is well known that one of the reasons for the limitation of the light emission efficiency of an EL element is the fact that more than half of light generated in the light-emitting layer is confined within the element or a transparent substrate, see, for example, Non-patent Document 1, i.e., *Advanced Materials*, Vol. 6, p. 491 (1994).

For extracting the light confined within the element or the transparent substrate to improve light emission efficiency, a microcavity or resonant cavity structure is well known, see, for example, Non-patent Document 2, Applied Physics Letters, vol. 64, p. 2486 (1994). An organic EL device applying this principle has been proposed, see, for example, Patent Documents 1 and 2, i.e., Japanese Unexamined Patent Application Publication No. H06-283271 and WO94/7344.

Application of the resonant cavity structure gives directivity to the photons generated in the light-emitting layer. Further, energy distribution of the photons or emission spectrum becomes sharp and peak light intensity grows up to from several to several tens of times higher. Thus, the resonant cavity structure achieves the effects of increasing the intensity of emitted light and giving a monochromatic property to the light obtained in the light-emitting layer.

In order to apply this resonant cavity EL element to a color display device, however, it is necessary to adjust the optical distance between a pair of mirrors composing the resonator for every pixel corresponding to red, blue, or green color. Thus, the manufacturing process is complicated. While it would be possible to use light-emitting layers corresponding to red, blue, and green colors for the pixels of respective colors and to vary the thicknesses of the light-emitting layers for adjusting the optical distance between the mirrors, the light emission efficiency and degradation rate, for example, vary from color to color, thus, changing driving characteristics between pixels to a large extent. Therefore, there are difficulties connected with making up a complete display device.

A method has been proposed to achieve a multicolor EL element in a simpler manufacturing process than the method that obtains a multicolor EL element using light-emitting layers corresponding to red (R), green (G), and blue (B) colors for subpixels of respective colors. That method, see Patent Document 3, i.e., Japanese Unexamined Patent Application Publication No. H03-152897, is a fluorescence conversion method that uses color conversion layers that absorb light emitted from the light-emitting layer and emit light with a different wavelength. Also disclosed is technology to combine the foregoing method with the resonant cavity EL element, see, Patent Documents 4 and 5, i.e., Japanese Patent No. 2838063 and Japanese Unexamined Patent Application Publication No. 2002-359076 (corresponding to U.S. Pat. No. 6,903,506). FIGS. 1(a) and 1(b) show an example of a resonant cavity organic EL element of the prior art. The resonant cavity organic EL element of FIG. 1(a) comprises a color conversion layer 540, a flattening layer 560, a semi-transparent reflective layer 552, a transparent electrode 522, a functional layer 530 that includes a light-emitting layer 532, and a reflective electrode 521. All of the layers are laminated on a transparent substrate 510. FIG. 1(a) shows an example of a resonant cavity organic EL element that has a functional layer 530 composed of a hole injection-transport layer 531, a light-emitting layer 532, and an electron injection-transport layer 533. A resonant cavity is formed by the semi-transparent reflective layer 552 and the reflective electrode 521, the latter also functioning as a non-transparent reflective layer 551. An effective optical path length 600 is determined by the semi-transparent reflective layer 552 and the reflective electrode 521 (551) and optimized according to the wavelength of light emitted from the light-emitting layer 532. The color conversion layer 540 is located outside the resonant cavity structure.

For composing a color EL display device with RGB subpixels employing resonant cavity structures and fluorescence conversion layers, as shown in FIG. 1(b), a blue color (B) subpixel radiates blue light emitted from the resonant cavity EL element, and a green color (G) subpixel and a red color subpixel radiate green and red light obtained by a red color conversion layer 540R and a green color conversion layer 540G respectively, in which the wavelength of the light emitted from the resonant cavity EL element is converted. As described previously, the light emitted from the resonant cavity EL element, which is a blue color output light, exhibits relatively strong directivity. On the other hand, the converted light radiating from, the color conversion layers 540R and 540G (red output light and green output light) is isotropic in radiation orientation.

Consequently, the color tone of the display device in FIG. 1(b) is strongly dependent on viewing angle. For example, white color at the direction normal to the display surface becomes yellowish at an oblique direction. Therefore, the device of FIG. 1(b) is not well suited for practical application.

SUMMARY OF THE INVENTION

The present invention has been made to solve these difficulties that arise in practical application of the resonant cavity EL element and the fluorescence conversion method to a color display device, and provides a high luminance color display device implementing high efficiency EL elements employing a simple manufacturing method.

A resonant cavity color conversion EL element according to a first embodiment of the invention comprises at least a pair of electrodes; a functional layer that includes a light-emitting layer and that is sandwiched by the pair of electrodes; a color conversion layer that absorbs light emitted from the light-emitting layer and emits light with a different wavelength; and a pair of light reflective layers, wherein the light-emitting layer and the color conversion layer are disposed between the pair of light reflective layers, wherein the pair of light reflective layers are composed of a non-transparent reflective layer and a semi-transparent reflective layer, and wherein the non-transparent reflective layer and the semi-transparent reflective layer have a distance therebetween that is set at an optical distance to construct a microcavity that increases intensity of light with a specific wavelength emitted from the color conversion layer.

It is possible in this first embodiment that the pair of electrodes is composed of a transparent electrode and a light reflective electrode, and the light reflective electrode can also function as the non-transparent reflective layer. The light reflective electrode can be formed of a metal or have a laminated structure that includes a metal and a transparent conductive layer. Specifically, the metal can be selected from the group consisting of elemental metals of Al, Ag, Mg, Zn, Ta, and alloys of these elemental metals. Or, the metal for forming the light reflective electrode can be an alloy composed of at least one element selected from the group consisting of Al, Ag, Mg, Zn, and Ta, and at least one element selected from the group consisting of Li, Na, K, Rb, Cs, and Ca.

A color conversion layer in this first embodiment can be disposed between the light-emitting layer and the semi-transparent reflective layer. The color conversion layer is preferably formed of solely one or more types of organic dyes.

The semi-transparent reflective layer can be a metallic film. Specifically, the metallic film composing the semi-transparent reflective layer can be formed of a metal selected from the group consisting of Ag, Au, Cu, Mg, Li, and an alloy mainly composed of these elements.

It is preferable in this first embodiment that a difference in refractive index for a wavelength range of light emitted from the light-emitting layer is at most 0.35 at every interface between adjacent layers that exist between the pair of light reflective layers.

An organic EL display device according to a second embodiment of the invention comprises the resonant cavity color conversion EL element defined by the first embodiment; and a resonant cavity EL element comprised of at least a pair of electrodes; a functional layer that includes a light-emitting layer that is sandwiched by the pair of electrodes; and a pair of light reflective layers, wherein the light-emitting layer is disposed between the pair of light reflective layers, and the pair of light reflective layers have a distance therebetween that is set at an optical distance to construct a microcavity that increases intensity of light with a specific wavelength emitted from the light-emitting layer; and wherein a blue color subpixel, a green color subpixel, and a red color subpixel are composed of either the resonant cavity color conversion EL element or the resonant cavity EL element.

For example, it is possible that the blue color subpixel is composed of the resonant cavity EL element and the green color subpixel and the red color subpixel are composed of the resonant cavity color conversion EL element. It is also possible that the blue color subpixel and the red color subpixel are composed of the resonant cavity EL element and the green color subpixel is composed of the resonant cavity color conversion EL element. It is further possible that the blue color subpixel and the green color subpixel are composed of the resonant cavity EL element and the red color subpixel is composed of the resonant cavity color conversion EL element.

It is possible, in the organic EL display device, that one of the pair of electrodes is a transparent electrode, and the color conversion layer is disposed between the transparent electrode and the semi-transparent reflective layer in the resonant cavity color conversion EL element.

The organic EL display device of this second embodiment can further comprises a color filter layer(s) for color(s) of the blue color subpixel; the green color subpixel, or the red color subpixel in a light-radiating side of either the resonant cavity color conversion EL element or the resonant cavity EL element in each subpixel.

In the resonant cavity color conversion organic EL element having a structure described above, the color conversion layer is disposed between a pair of reflective layers that compose a microcavity structure and the optical path length of the microcavity structure is adjusted to fit to the resonance condition of the light with a specific wavelength emitted from the color conversion layer, thereby intensifying the converted light from the color conversion layer. When the color conversion layer is formed of solely one or more types of organic dyes, in particular, the refractive index of the color conversion layer can be made nearly equal to the refractive index of the thin film materials composing the EL element. As a result, the color conversion layer absorbs most of the light emitted by the light-emitting layer and performs fluorescent conversion, further intensifying the converted light from the color conversion layer.

By combining the resonant cavity color conversion EL element of the invention with a resonant cavity EL element to produce a color display device, a high efficiency organic EL display device that does not exhibit viewing angle dependence of color tone is provided through a simple production process. The reason is because the converted light radiating from the resonant cavity color conversion EL element is given directivity by the existing microcavity structure, and the directivity is approximately equivalent to the directivity of the light radiating from the resonant cavity EL element.

BRIEF DESCRIPTION OF THE VARIOUS VIEWS OF THE DRAWING

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

FIGS. 1(a) and 1(b) show a resonant cavity EL element and a display device using the EL element of the prior art, in which FIG. 1(a) shows a resonant cavity EL element and FIG. 1(b) shows a display device;

FIGS. 2(a) and 2(b) show examples of resonant cavity color conversion EL devices according to a first embodiment of the invention, in which FIG. 2(a) shows an example with an reflective electrode of single layer structure and FIG. 2(b) shows an example with the reflective electrode of a laminated structure of a metallic layer and a transparent conductive layer;

DETAILED DESCRIPTION OF THE INVENTION

Resonant Cavity Color Conversion EL Element

Figure 1A:
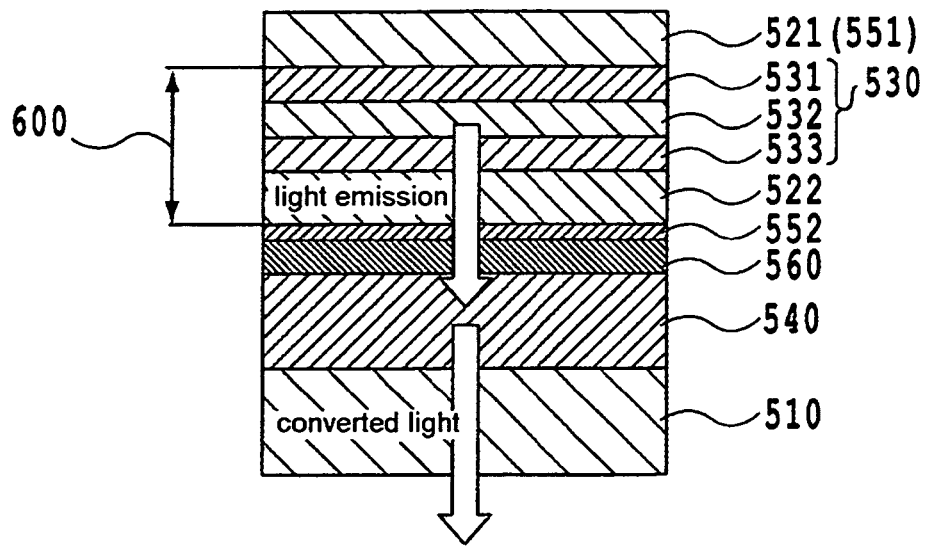

A resonant cavity color conversion EL element according to a first embodiment of the present invention has a microcavity structure formed by a pair of light reflective layers in which a light-emitting layer and a color conversion layer are included. An effective optical path length of the microcavity, which is the distance between the pair of light reflective layers, is set so as to intensify a specific wavelength of the light emitted from the color conversion layer.

Specifically, a resonant cavity color conversion EL element comprises at least one pair of electrodes; a functional layer that is sandwiched by the pair of electrodes and that includes a light-emitting layer; a color conversion layer that absorbs light emitted from the light-emitting layer and emits light with a different wavelength; and a pair of light reflective layers. The pair of light reflective layers is composed of a non-transparent reflective layer and a semi-transparent reflective layer, and the light-emitting layer and the color conversion layer are disposed between the pair of light reflective layers.

The statement "setting so as to intensify a specific wavelength of the light emitted from the color conversion layer" means a condition to induce resonance and intensify the light with a wavelength $\lambda_{CCM}$ emitted from the color conversion layer perpendicularly to the surface of the element, and means a condition which satisfies the inequality of formula (1).

$$0.9\lambda_{CCM} \leq 4\pi\Sigma n_i d_i/(2m\pi-\delta) \leq 1.1\lambda_{CCM} \quad (1),$$

where $\Sigma$ means summation over all layers existing between the pair of light reflective layers; $n_i$ and $d_i$ represent a refractive index and a thickness, respectively, of a layer i existing between the pair of light reflective layers; $\delta$ represents a phase shift upon light reflection at the pair of light reflective layer; and m is an integer.

The phase shift $\delta$ upon light reflection is a sum of a phase shift upon reflection at the semi-transparent reflective layer and a phase shift upon reflection at the non-transparent reflective layer. The phase shift $\delta$ can be obtained by a known method disclosed in references (see, for example, Non-patent Documents 3 and 4, Max Born and Emil Wolf, *Principles of Optics* Second Edition, 1964, Pergamon Press, and O. S. Heavens, *Optical Properties of Thin Solid Films,* 1991, Dover Publishing Inc.

The condition of formula (1) above assumes (a) that the refractive index of every layer in the microcavity structure, i.e., every layer between the pair of light reflective layers, is approximately equal thus causing no reflection at the interfaces of those layers, and (b) that reflection of light occurs solely at the semi-transparent reflective layer and at the non-transparent reflective layer. In the invention, however, materials of the layers within the microcavity structure are selected such that a difference of refractive indices of adjacent two layers in the wavelength range of the light emitted from the light-emitting layer is preferably at most 0.35, more preferably, at most 0.25, at every interface between the adjacent two layers within the microcavity structure. Therefore, the assumption that no reflection occurs at interfaces between the layers within the microcavity structure is sufficiently valid, and the condition of formula (1) is sufficiently reasonable for determining thicknesses of the layers within the microcavity structure in the object of the invention.

In a case where reflection at one or more interfaces within the microcavity structure cannot be ignored, an alternative method to determine thicknesses of the layers in the microcavity structure can be applied in which a condition for resonance of the light with wavelength $\lambda_{CCM}$ is theoretically obtained by sequential calculation employing complex refractive index of each layer taking reflection at the interface into consideration.

Instead, thicknesses of the layers are once determined using formula (1), and then several elements are fabricated, the elements having a total thickness near the sum of the determined thicknesses, but one of the layers having a thickness changed, for example, by 10 nm. From those elements, a condition of the thicknesses for intensifying the wavelength $\lambda_{CCM}$ can be found.

Figure 2A:
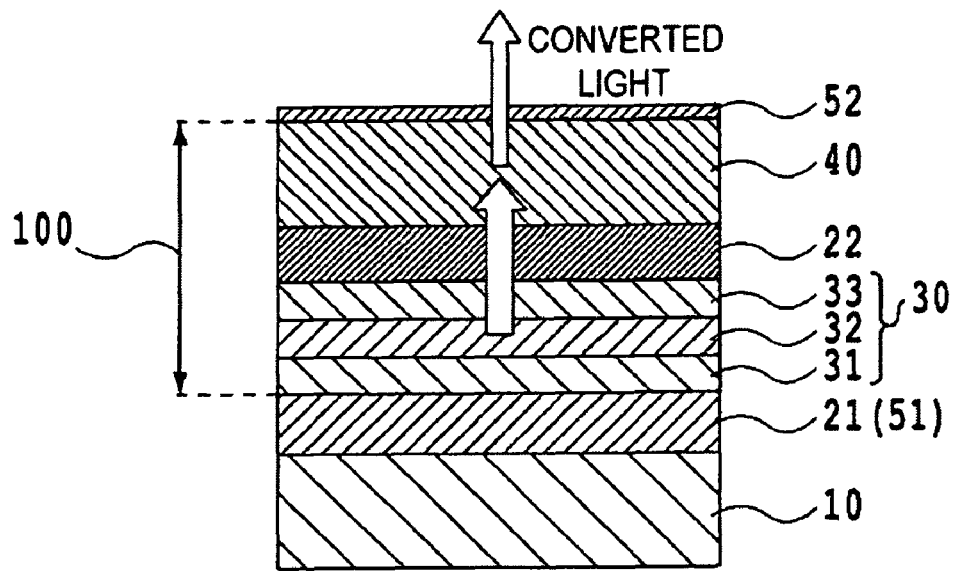
Figure 2B:
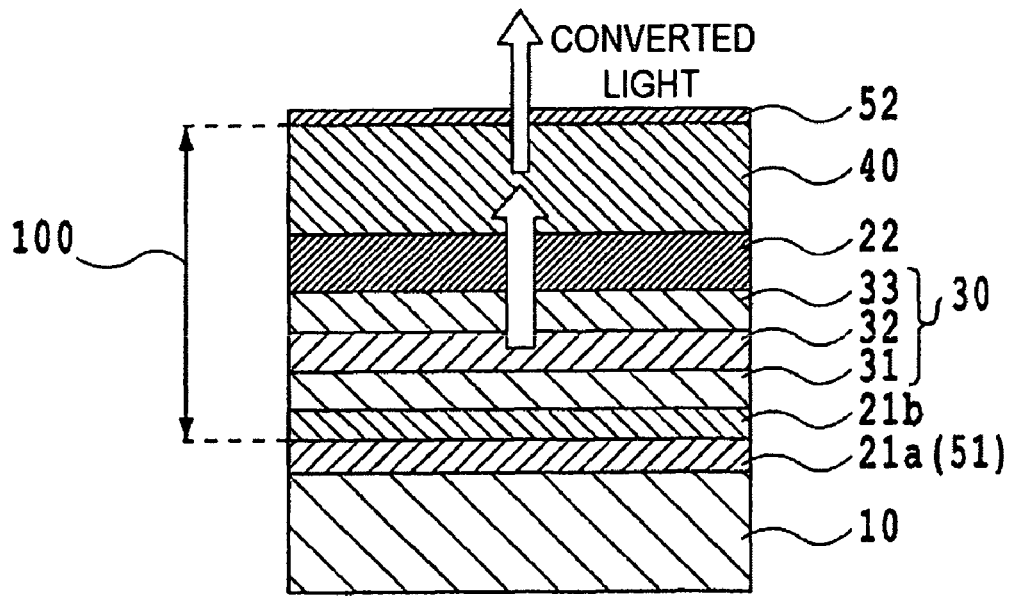

FIGS. 2(a) and 2(b) show an example of structure of a resonant cavity color conversion EL element according to the first embodiment of the invention. The element of FIG. 2(a) comprises a reflective electrode 21, a functional layer 30, a transparent electrode 22, a color conversion layer 40, and a semi-transparent reflective layer 52 laminated on a substrate 10. The reflective electrode 21 and the transparent electrode 22 compose a pair of electrodes. The reflective electrode 21 functions also as a non-transparent reflective layer 51 and, together with the semi-transparent reflective layer 52, composes a pair of light reflective layers. The example of FIG. 2(a) has a functional layer 30 that consists of an electron injection-transport layer 31, a light-emitting layer 32, and a hole injection-transport layer 33.

In the element shown in FIG. 2(a), a microcavity is composed of the reflective electrode 21 and the semi-transparent reflective layer 52, defining the effective optical path length 100 of the microcavity. Objects of the formula (1) in this element are the layers composing the functional layer 30, the transparent electrode 22, and the color conversion layer 40. Materials and thicknesses of those layers are determined so as to satisfy the condition of formula (1).

FIG. 2(b) shows a variation of a resonant cavity color conversion EL element. The element of FIG. 2(b) is similar to the element of FIG. 2(a) except that the reflective electrode 21 is a lamination of a metallic layer 21a and a transparent conductive layer 21b. The metallic layer 21a functions as a non-transparent reflective layer 51 in this variation. Thus, a microcavity is composed of the metallic layer 21a and the semi-transparent reflective layer 52, defining the effective optical path length 100 of the microcavity. Objects of the formula (1) in this element are the layers composing the functional layer 30, the transparent electrode 22 and the color conversion layer 40 and, in addition, the transparent conductive layer 21b. Materials and thicknesses of those layers are determined so as to satisfy formula (1). Advantages of the lamination structure of the reflective electrode 21 consisting of the metallic layer 21a and the transparent conductive layer 21b exist in that the optical path length of the microcavity structure can be adjusted by the transparent conductive layer 21b, and that good hole injection performance can be ensured when the functional layers are inverted such that the hole injection transport layer 33 is adjacent to the reflective electrode 21.

Figure 3:
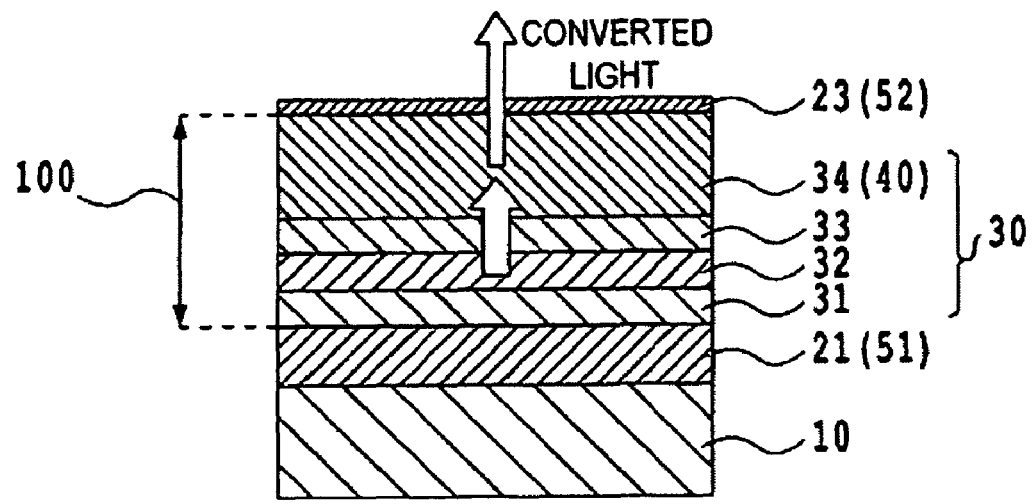
FIG. 3 shows another example of a resonant cavity color conversion EL element according to the first embodiment of the invention.

FIG. 3 shows another example of a structure of a resonant cavity color conversion EL element according to the first embodiment of the invention. The element of FIG. 3 comprises a reflective electrode 21, a functional layer 30, and a semi-transparent electrode 23 laminated on a substrate 10. The reflective electrode 21 and the semi-transparent electrode 23 compose a pair of electrodes. The reflective electrode 21 functions as a non-transparent reflective layer 51, and the semi-transparent electrode 23 functions as a semi-transparent reflective layer 52. The reflective electrode 21 and the semi-transparent electrode 23 compose a pair of light reflective layers.

The example shown in FIG. 3 has a functional layer 30 consisting of an electron injection-transport layer 31, a light-emitting layer 32, a hole injection-transport layer 33, and a carrier-transporting color conversion layer 34 (40). In the example of FIG. 3, the carrier-transporting color conversion layer 34 (40) has a hole-transporting property and is in contact with the semi-transparent electrode 23. However, a structure is also possible in which the carrier-transporting color conversion layer 34 (40) has an electron-transporting property and is disposed in contact with the reflective electrode 21.

In the element shown in FIG. 3, the reflective electrode 21 and the semi-transparent electrode 23 compose a microcavity, and define an effective optical path length 100 of the microcavity. Objects of the condition of formula (1) in this element are the electron injection-transport layer 31, the light-emitting layer 32, the hole injection-transport layer 33 composing the functional layer 30, and the carrier-transporting color conversion layer 34 (40). Materials and thicknesses of those layers are determined so as to satisfy formula (1). The reflective electrode 21 can be a laminated structure of a metallic layer and a transparent conductive layer in this example, as well. In that case, an effective optical path length of the microcavity is defined similarly to the structure of FIG. 2(b).

Figure 4:
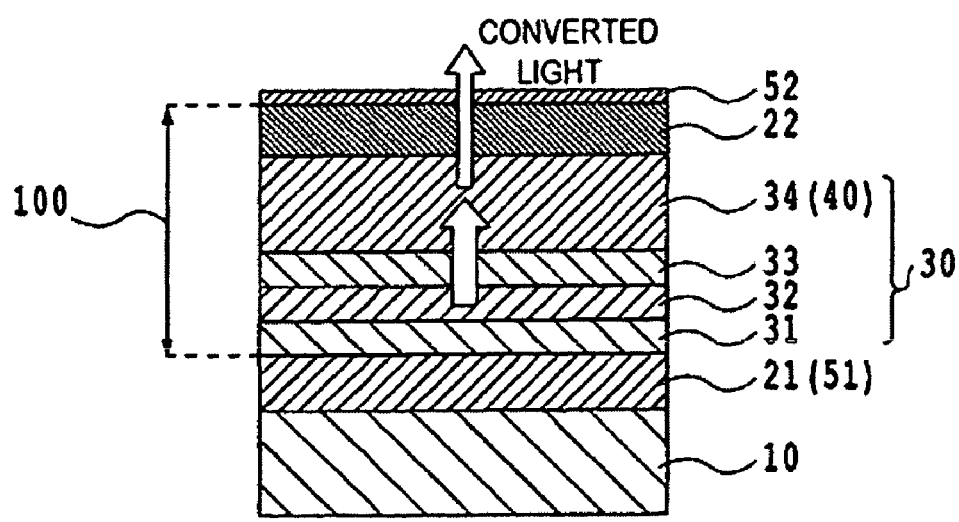
FIG. 4 shows still another example of a resonant cavity color conversion EL element according to the first embodiment of the invention.

FIG. 4 shows still another example of a structure of a resonant cavity color conversion EL element according to the first embodiment of the invention. The element of FIG. 4 comprises a reflective electrode 21, a functional layer 30, a transparent electrode 22, and a semi-transparent reflective electrode 52 laminated on a substrate 10. The reflective electrode 21 and the transparent electrode 22 compose a pair of electrodes. The reflective electrode 21 also functions as a non-transparent reflective layer 51. The reflective electrode 21 and the semi-transparent reflective electrode 52 compose a pair of light reflective layers.

The example shown in FIG. 4 has a functional layer 30 consisting of an electron injection-transport layer 31, a light-emitting layer 32, a hole injection-transport layer 33, and a carrier-transporting color conversion layer 34 (40).

In the element shown in FIG. 4, the reflective electrode 21 and the semi-transparent reflective electrode 52 compose a microcavity, and define an effective optical path length 100 of the microcavity. Objects of the condition of formula (1) in this element are the layers composing the functional layer 30, and the transparent electrode 22. Materials and thicknesses of those layers are determined so as to satisfy formula (1). The reflective electrode 21 can be a lamination of a metal layer and a transparent conductive layer in this example, too. In that case, an effective optical path length of the microcavity is defined similarly to the structure of FIG. 2(b).

In the resonant cavity color conversion EL elements shown in FIGS. 2(a), 2(b), 3, and 4, the light reflective electrode 21 is used for a cathode, and the transparent electrode 22 or the semi-transparent electrode 23 is used for an anode. However, it is also possible in this aspect of embodiment to use the light reflective electrode 21 for an anode, and the transparent electrode 22 or the semi-transparent electrode 23 for a cathode. In that case, the functional layer 30 consists, from the side of the light reflective electrode 21, of a hole injection-transport layer 33, a light-emitting layer 32, and electron injection-transport layer 31, and if existing, a carrier transporting color conversion layer 34.

Of the layers composing the functional layer 30 in the resonant cavity color conversion EL element shown in FIGS. 2(a), 2(b), 3, and 4, the electron injection-transport layer 31 and the hole injection-transport layer 33 can be optionally provided. Each of the electron injection-transport layer 31 and the hole injection-transport layer 33 can be a single layer or a laminated structure consisting of a plurality of layers. For example, the electron injection-transport layer 31 can consists of an electron injection layer and an electron transport layer, and the hole injection-transport layer can consists of a hole injection layer and a hole transport layer.

Details of components of EL elements are described in the following.

Substrate 10

A substrate 10 of the invention can be formed using materials that are commonly used for a substrate in flat panel display devices. For example, glass (non-alkaline or alkaline) and plastics such as polycarbonate can be used for forming the substrate 10. Light from the light-emitting layer 32 in the organic EL elements shown in FIGS. 2(a), 2(b), 3, and 4 is emitted without passing through the substrate, so the substrate 10 is not necessarily transparent. Consequently, the substrate 10 can be formed using opaque materials, such as silicon or ceramics. It is also possible to use a silicon substrate having a plurality of switching elements (such as TFTs) for the substrate 10.

Pair of Reflective Layers

Non-Transparent Reflective Layer 51

A non-transparent reflective layer 51 of the invention can be formed using a metal, an amorphous alloy, or a microcrystalline alloy, that exhibit high reflectivity. High reflectivity metals include Al, Ag, Mg, Ta, Zn, Mo, W, Ni and Cr. High reflectivity amorphous alloys include NiP, NiB, CrP and CrB. High reflectivity microcrystalline alloys include NiAl and Ag alloys. Thickness of the non-transparent reflective layer 51 is set taking sheet resistance, reflectivity, and surface flatness into consideration, and is generally in the range of 50 to 200 nm. A layer with a thickness in this range sufficiently reflects light from a light-emitting layer 32 and converts light from a color conversion layer 40, serving, in effect, as a microcavity.

Semi-Transparent Reflective Layer 52

A semi-transparent reflective layer 52 in the invention would be fabricated using a one dimensional photonic crystal, such as a dielectric multilayer film, that transmits solely light in a specific wavelength range. Fabrication of the one dimensional photonic crystal, however, must employ a complicated process that needs multiple deposition steps and strict control of film thickness. In view of the objective of simplification of the fabrication process, a metallic thin film is preferably used for the semi-transparent reflective layer 52 in the invention.

A metallic material for forming a semi-transparent reflective layer 52 preferably exhibits little absorption of visible light. Preferable metallic materials in the invention include Ag, Au, Cu, Li, Mg, and alloys with a major component of these metals. The wording "major component" means that 50 at % or more in the alloy is the metals of above listing.

Thickness of a semi-transparent reflective layer 52 when formed with a metal thin film is an important factor to determine the emission spectrum and the light intensity of a resonant cavity color conversion EL element according to this embodiment of the invention. A thickness of the semi-transparent reflective layer 52 is preferably adjusted in the range between 5 nm to 50 nm depending on the metallic material used, and necessary emission spectrum and light intensity. A semi-transparent reflective layer 52 having a thickness in this range is able to provide two opposite but necessary performances at the same time, i.e., sufficient reflectivity to the light from the color conversion layer to obtain adequate microcavity effect, and sufficient transparency to the converted light emitted from the color conversion layer 40 to avoid significant weakening of the radiated light from the element.

Pair of Electrodes

Light Reflective Electrode 21

A light reflective electrode 21 of the invention can be formed, like the non-transparent reflective layer 51, using a high reflectivity metal, amorphous alloy, or microcrystalline alloy. A light reflective electrode 21 formed of these materials has a thickness preferably in the range of 50 to 200 nm to exhibit sufficient reflectivity.

A light reflective electrode 21 of the invention can also be a lamination of a metallic layer 21a made of the above-mentioned metals and alloys and a transparent conductive layer 21b. A metallic layer 21a in this case has preferably a thickness in the range of 50 to 200 nm to exhibit sufficient reflectivity. The transparent conductive layer 21b can be formed using a commonly-known transparent conductive oxide, such as ITO (indium-tin oxide), IZO (indium-zinc oxide), IWO (indium-tungsten oxide), or AZO (aluminum-doped zinc oxide). The transparent conductive layer 21b can also be formed using a high conductivity polymer material such as poly(3,4-ethylene dioxythiophene):poly(styrene sulfonate) (PEDOT:PSS).

It is possible to use the light reflective electrode 21 formed of a metal or alloy, or the metallic layer 21a in the metallic layer-transparent conductive layer structure as the non-transparent reflective layer 51.

Transparent Electrode 22

A transparent electrode 22 of the invention can be formed using a commonly-known transparent conductive oxide, such as ITO (indium-tin oxide), IZO (indium-zinc oxide), IWO (indium-tungsten oxide), or AZO (aluminum-doped zinc oxide). The transparent electrode 22 can also be formed using a high conductivity polymer material such as poly(3,4-ethylene dioxythiophene):poly(styrene sulfonate) (PEDOT:PSS).

Semi-Transparent Electrode 23

A semi-transparent electrode 23 of the invention can be formed, like the semi-transparent reflective layer 52, using a metallic material exhibiting little absorption for visible light. Useful metallic materials include Ag, Au, Cu, Li, Mg, and alloys mainly composed of these metals. The semi-transparent electrode 23 has a thickness in the range of 5 nm to 50 nm depending on the metallic material used and the necessary emission spectrum and light intensity. A semi-transparent electrode 23 having a thickness in this range provides two contrary requirements at the same time, i.e., sufficient reflectivity to set up a resonance of converted light emitted from the color conversion layer 40, and sufficient transparency to avoid significant attenuation of converted light though the semi-transparent electrode.

Functional Layer 30

Electron Injection-Transport Layer 31

An electron injection-transport layer 31 can be a single layer formed of a material exhibiting good electron injection property from a cathode and high electron transport capability. However, it is generally preferable that the layer 31 be composed of two separated layers, i.e., an electron injection layer for promoting electron injection from a cathode into the organic layer, and an electron transport layer for transporting electrons to the light-emitting layer 32. An electron injection-transport layer 31 having the two layer construction preferably takes a structure with the electron injection layer in contact with the cathode and the electron transport layer in contact with the light-emitting layer 32.

An electron transport layer can be formed using a specific material selected from triazole derivatives, such as 3-phenyl-4-(1'-naphthyl)-5-phenyl-1,2,4-triazole (TAZ); oxadiazole derivatives, such as 1,3-bis[(4-t-buthyl phenyl)-1,3,4-oxadiazol]phenylene (OXD-7), 2-(4-biphenylyl)-5-(4-t-buthyl phenyl)-1,3,4-oxadiazole (PBD), and 1,3,5-tris(4-t-butyl phenyl-1,3,4-oxadiazolyl)benzene (TPOB); thiophene derivatives, such as 5,5'-bis(dimesitylboryl)-2,2'-bithiophene (BMB-2T) and 5,5'-bis(dimesitylboryl)-2,2':5',2'-terthiophene (BMB-3T); an aluminum complex, such as tris(8-quinolinolato) aluminum ($Alq_3$); phenanthroline derivatives, such as 4,7-diphenyl-1,10-phenanthroline (BPhen) and 2,9-dimethyl-4,7-diphenyl-1,10-phenanthroline (BCP); and silole derivatives, such as 2,5-di-(3-biphenyl)-1,1-dimethyl-3,4-diphenyl silacyclopentadiene (PPSPP), 1,2-bis(1-methyl-2,3,4,5-tetraphenyl silacyclopentadienyl)ethane (2PSP), and 2,5-bis-(2,2-bipyridine-6-yl)-1,1-dimethyl-3,4-diphenyl silacyclopentadiene (PyPySPyPy).

An electron injection layer can be formed using alkali metal chalcogenides, such as $Li_2O$, LiO, $Na_2S$, $Na_2Se$, and NaO; alkaline earth metal chalcogenides, such as CaO, BaO, SrO, BeO, BaS, and CaSe; alkali metal halides, such as LiF, NaF, KF, CsF, LiCl, KCl, and NaCl; alkaline earth metal halides, such as $CaF_2$, $BaF_2$, $SrF_2$, $MgF_2$, and $BeF_2$; and alkali metal carbonates, such as $Cs_2CO_3$. An electron injection layer formed of these materials preferably has a thickness in the range of 0.5 to 1.0 nm.

Instead, the electron injection layer can be formed of a thin film (with a thickness of 1.0 to 5.0 nm) of alkali metal, such as Li, Na, K, or Cs, or alkaline earth metal, such as Ca, Ba, Sr, or Mg.

Alternatively, the electron injection layer for promoting electron injection from a cathode can be formed using one of the above-mentioned electron transport layer materials that are doped with a material selected from alkali metals, such as Li, Na, K, and Cs; alkali metal halides, such as LiF, NaF, KF and CsF; and alkali metal carbonates, such as $Cs_2O_3$.

Light-Emitting Layer 32

A material for a light-emitting layer 32 can be selected according to desired color tone. For effective excitation and emission of light in the color conversion layer 40, the light-emitting layer 32 is preferably formed using a material that exhibits light emission in a blue color to blue-green color. The materials that emit light emission in a blue color to blue-green color include fluorescent brightening agents, such as benzothiazole, benzoimidazole, and benzoxazole compounds; styryl benzene compounds; and aromatic dimethylidyne compounds. Preferred specific materials for forming a light-emitting layer 32 include 9,10-di(2-naphthyl)anthracene (ADN), 4,4'-bis(2,2'-diphenylvinyl)biphenyl (DPVBi), 2-methyl-9,10-di(2-naphthyl) anthracene (MADN), 9,10- bis-(9,9-di(n-propyl)fluorene-2-yl)anthracene (ADF), and 9-(2-naphthyl)-10-(9,9-di(n-propyl)-fluorene-2-yl)anthracene ANF).

Hole Injection-Transport Layer 33

A hole injection-transport layer 33 can have a single layer structure made of a material that exhibits good hole injection performance from an anode and high hole transport capability. However, it is generally preferable to compose a hole injection-transport layer by laminating two separated layers including a hole injection layer for promoting hole injection from an anode to the organic layer, and a hole transport layer for transporting holes into the light-emitting layer 32.

A hole injection-transport layer 33 having the two-layer construction preferably takes a structure with the hole injection layer in contact with the anode and the hole transport layer in contact with the light-emitting layer 32.

Materials for forming a hole injection-transport layer 33 can be selected from materials having a triarylamine partial structure, materials having a carbazole partial structure, and materials having an oxadiazole partial structure, which are hole transport materials commonly used in organic EL devices. Useful specific materials for forming a hole injection-transport layer 33 include N,N'-diphenyl-N,N'-bis(3-methylphenyl)-1,1'-biphenyl-4,4'-diamine (TPD), N,N,N',N'-tetrakis(4-methoxyphenyl)-benzidine (MeO-TPD), 4,4',4"-tris{1-naphthyl(phenyl)amino}triphenylamine (1-TNATA), 4,4',4"-tris{2-naphthyl(phenyl)amino}triphenylamine (2-TNATA), 4,4',4"-tris(3-methyphenyl-phenylamino)triphenylamine (m-MTDATA), 4,4'-bis{N-(1-naphthyl)-N-phenylamino}biphenyl (NPB), 2,2',7,7'-tetrakis(N,N-diphenylamino)-9,9'-spiro-bifluorene (Spiro-TAD), N,N'-di(biphenyl-4-yl)-N,N'-diphenyl-(1,1'-biphenyl)-4,4'-diamine (p-BPD), tri(o-terphenyl-4-yl)amine (o-TTA), tri(p-terphenyl-4-yl)amine (p-TTA), 1,3,5-tris[4-(3-methylphenyl-phenylamino) phenyl]benzene (m-MTDAPB), and 4,4',4"-tris-9-carbazolyl triphenylamine (TCTA).

A hole injection layer can be formed of one of the above-mentioned hole transport materials into which an electron acceptor is doped (p-type doping). Useful electron acceptors include organic semiconductors, such as tetracyano-quinodimethane derivatives. One of the typical tetracyano-quinodimethane derivatives is 2,3,5,6-tetrafluoro-7,7,8,8-tetracyano-quinodimethane ($F_4$-TCNQ). Other useful electron accepting dopants include inorganic semiconductors, such as molybdenum trioxide ($MoO_3$), tungsten trioxide ($WO_3$), and vanadium pentoxide ($V_2O_5$).

Carrier Transporting Color Conversion Layer 34

A carrier transporting color conversion layer 34 has a property of electron injection-/transport or hole injection-transport, and at the same time, a function of color conversion. A carrier transporting color conversion layer 34 includes a host material and one or more types of color conversion dyes. The host material favorably has a carrier transporting property and an ability to absorb light emitted from the light-emitting layer 32 and generate singlet excitons.

Useful host materials for a carrier transporting color conversion layer 34 having an electron injection-transport property include $Znsq_2$ and $Alq_3$. The color conversion dye is either (a) a dye that directly absorbs light emitted by the light-emitting layer (incident light), converting wavelength distribution, and emits light having different wavelength distribution (converted light), or (b) a dye that receives energy of excitons in the host material that has absorbed light emitted by the light-emitting layer, and emits light having a different wavelength distribution from that of the light emitted by the light-emitting layer. A color conversion dye used in the invention can be a dye that absorbs light in the blue to blue green color range and emits light in a red color or a green color. Useful materials for the color conversion dye that absorbs light in the blue to blue-green color range and emits light in the red color include dicyanine dyes, such as 4-dicyanomethylene-2-methyl-6-(p-dimethylaminostyryl)-4H-pyran (DCM-1, a substance represented by the chemical formula I given later), DCM-2 (II), and DCJTB (III); pyridine materials, such as 1-ethyl-2-(4-(p-dimethylaminophenyl)-1,3-butadienyl)-pyridium-perchlorate (Pyridine 1); xanthene materials of rhodamine compounds; oxadine materials; coumarin dyes; acridine dyes; and other condensed aromatic ring materials, such as diketopyrrolo[3,4-c] pyrrole derivatives, benzoimidazole compounds fused with an analog of thiadiazole heterocycle, compounds of porphyrin derivatives, quinacridone compounds, and bis(aminostyryl)naphthalene compounds.

The color conversion dyes that absorb light in the blue to blue-green color region and emit green color light include, for example, coumarin dyes, such as 3-(2'-benzthiazolyl)-7-diethylamino-coumarin (coumarin 6), 3-(2'-benzimidazolyl)-7-diethylamino-coumarin (coumarin 7), 3-(2'-N-methylbenzimidazolyl)-7-diethylamino-coumarin (coumarin 30), and 2,3,5,6-1H,4H-tetrahydro-8-trifluoromethyl quinolidine (9,9a,1-gh)-coumarin (coumarin 153); basic yellow 51, which is a type of coumarin dye; and naphthalimide dyes such as solvent yellow 11 and solvent yellow 116.

Host materials for use in the carrier transporting color conversion layer 34 having a hole injection-transport property can be selected from hole transport materials of low molecular weight perylene compounds, such as BAPP and BABP, and high molecular weight perylene compounds, such as CzPP and CzBP, see, Patent Document 6, i.e., Japanese Unexamined Patent Application Publication No. 2004-115441. Other useful host materials are the fluorescent compounds with a hole-transport property, such as azaaromatic compounds having an azafluoranthene skeleton bonded with an arylamino group, see Patent Document 7, i.e., Japanese Unexamined Patent Application Publication No. 2003-212875, fused aromatic compounds having a fluoranthene skeleton bonded with an amino group(s) (see Patent Document 8, i.e., Japanese Unexamined Patent Application Publication No. 2003-238516), triphenylene aromatic compounds having an amino group(s) (see Patent Document 9, i.e., Japanese Unexamined Patent Application Publication No. 2003-081924), and perylene aromatic compounds having an amino group(s) (see Patent Document 10, i.e., WO2003/048268). Color conversion dyes in the carrier transporting color conversion layer exhibiting the hole injection-transport property can be the same materials as in the carrier transporting color conversion layer exhibiting the electron injection-transport property that are described previously.

Color Conversion Layer 40

A color conversion layer 40 in the invention is formed by depositing at least one type of fluorescent dye by a dry process, such as a vapor deposition method or a printing technique, such as inkjet printing or gravure printing. A color conversion layer 40 in the invention has a thickness not larger than 2,000 nm (2 μm), preferably in the range of 100 to 2,000 nm, more preferably in the range of 100 to 1,000 nm.

Useful fluorescent dyes for the invention include organic fluorescent dyes with a low molecular weight, which can be aluminum chelate dyes, such as $Alq_3$; coumarin dyes, such as 3-(2-benzthiazolyl)-7-diethylamino coumarin (coumarin 6), 3-(2-benzimidazolyl)-7-diethylamino coumarin (coumarin 7), and coumarin 135; and naphthalimide dyes, such as solvent yellow 43 and solvent yellow 44. Useful fluorescent dyes also include various types of polymer light-emitting materials represented by polyphenylene, polyarylene, and polyfluorene compounds.

In another method, a color conversion layer is formed of a mixture of two types of fluorescent dyes, i.e., a fluorescent dye selected from above-described ones and a second fluorescent dye added to the former. In this composition, the former, which is selected from the fluorescent dyes described previously, absorbs incident light to the color conversion layer 40, preferably blue to blue-green light emitted by an organic EL element, and transfers energy of the absorbed light to the second fluorescent dye, which in turn emits light with a desired wavelength. Preferred fluorescent dyes useful for the second fluorescent dye include quinacridone derivatives, such as diethyl quinacridone (DEQ); cyanine dyes, such as DCM-1 (I), DCM-2 (II), and DCJTB (III); xanthene dyes, such as rhodamine B and rhodamine 6G; pyridine dyes, such as pyridine 1; 4,4-difluoro-1,3,5,7-tetraphenyl-4-bora-3a,4a-diaza-s-indacene (IV); Lumogen F Red; and Nile Red (V).

Chemical formula 1

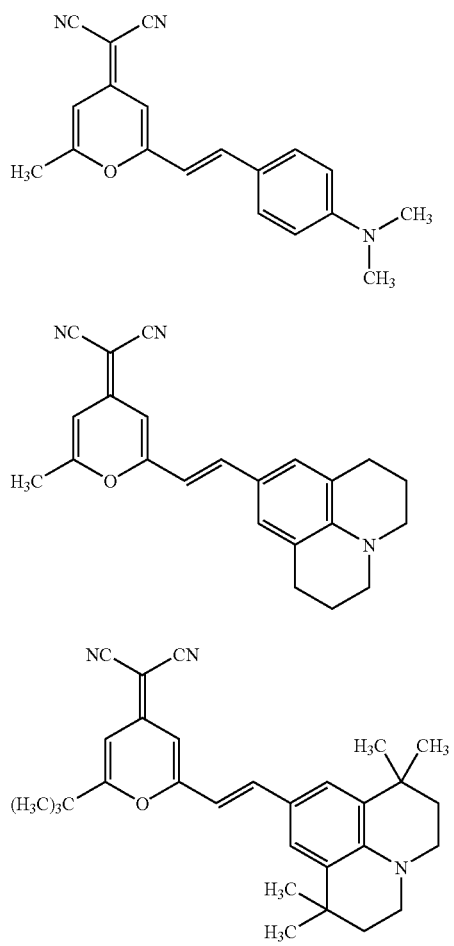

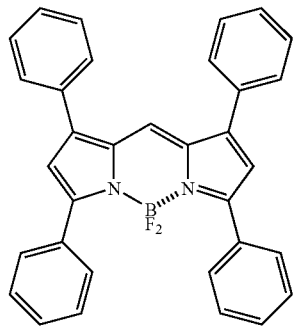

(IV)

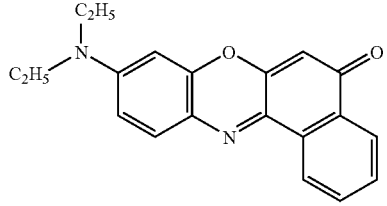

(V)

It is important for the second fluorescent dye not to give rise to concentration quenching, because the second fluorescent dye is the material to radiate desired light and concentration quenching causes a decrease in color conversion efficiency. The upper limit of concentration of the second fluorescent dye in the color conversion layer 40 in the invention varies depending on the material used. Preferable the concentration of the second fluorescent dye in the color conversion layer 40 in the invention is not larger than 10 mol %, preferably in the range of 0.01 to 10 mol %, more preferably in the range of 0.1 to 5 mol %, with respect to the total number of constituent molecules in the color conversion layer 40. Use of the second fluorescent dye with a concentration in this range avoids concentration quenching and gives sufficient intensity of the converted light.

The composition including the additive of a second fluorescent dye is effective in the case with a significant wavelength shift, such as conversion from a blue color to a red color, because a large difference between the peak wavelength of absorbed incident light and the peak wavelength of emitted light through color conversion can be obtained. Moreover, because the functions are separated, the range of selection for the fluorescent dyes is expanded.

A second embodiment of the invention is an organic EL display device. An organic EL display device according to an embodiment of the invention comprises a resonant cavity color conversion EL element(s) of the first embodiment of the invention; and a resonant cavity EL element(s) comprising at least one pair of electrodes; a functional layer including a light-emitting layer sandwiched by the pair of electrodes; and a pair of light reflective layers, wherein the light-emitting layer is disposed between the pair of light reflective layers, and distance between the pair of light reflective layers is set at an optical distance at which a microcavity is established that increases intensity of light with a specific wavelength emitted from the light-emitting layer; wherein each of subpixels for blue, green and red colors is composed of the resonant cavity color conversion EL element or the resonant cavity EL element.

A resonant cavity EL element in the invention can take the same construction as a resonant cavity color conversion EL element stated in the first embodiment except that the resonant cavity EL element does not comprise a layer performing a color conversion function. i.e., a color conversion layer or a carrier transporting color conversion layer, and that distance between the pair of light reflective layers is set at an optical distance that increases intensity of light with a specific wavelength emitted from the light-emitting layer.

Figure 5:
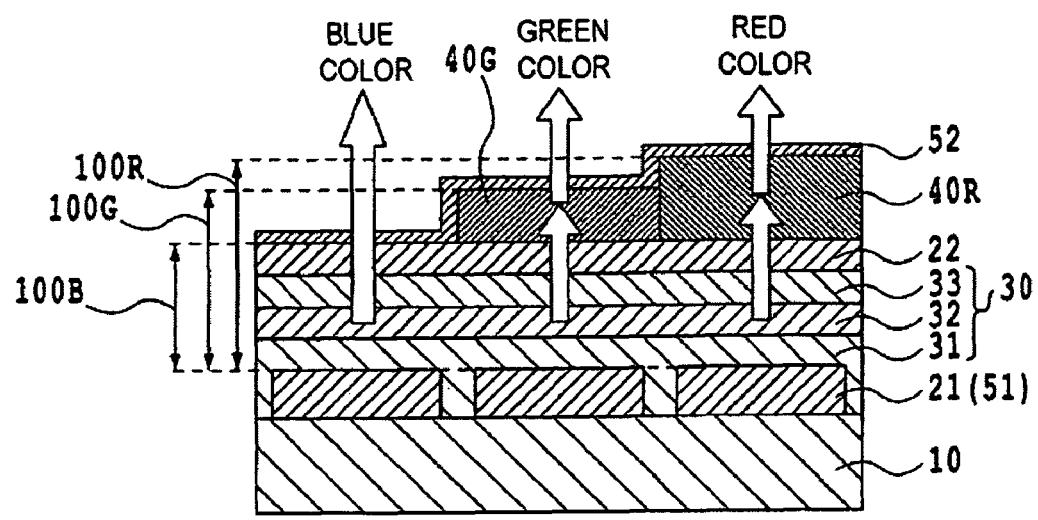
FIG. 5 shows an example of an organic EL display device according to a second embodiment of the invention.

FIG. 5 shows an example of an organic EL display device according to the second embodiment of the invention. The organic EL display device shown in FIG. 5 is composed of resonant cavity color conversion organic EL elements having a structure shown in FIG. 2 for red color and green color subpixels, and a resonant cavity organic EL element for a blue color subpixel. Thicknesses of a red color conversion layer 40R and a green color conversion layer 40G are appropriately set to define a distance 100R and a distance 100G adjusted for the red and green color subpixels between a semi-transparent reflective layer 52 covering the whole display surface and respective reflective electrodes 21 that function as non-transparent reflective layer 51.

In the blue color subpixel, the distance 100B between a semi-transparent reflective layer 52 formed on the transparent electrode 22 and the reflective electrode 21 is set at an optical distance to increase the intensity of blue color light emitted by the light-emitting layer 32. In the green color and red color subpixels, on the other hand, the distances 100G and 100R between the semi-transparent reflective layer 52 formed on the color conversion layers 40G and 40R and the reflective electrodes 21 are set at optical distances to increase the intensity of the green color and red color light emitted from the color conversion layers 40G and 40R.

It is convenient in this aspect of embodiment to share, as shown in FIG. 5, a common pair of electrodes (21, 22) and a common functional layer 30 for the resonant cavity organic EL element and the resonant cavity color conversion organic EL element. This structure allows passive matrix driving and active matrix driving constructions as in usual organic EL display devices.

It is also convenient in this embodiment to form the color conversion layers 40 (G, R) of the resonant cavity color conversion organic EL elements between the transparent electrode 22, which is one of the pair of electrodes, and the semi-transparent reflective layer 52. This construction facilitates fabrication of a color conversion layer 40 (G, R) corresponding to each color and allows a distance between the pair of reflective layers to be adjusted to a desired optical distance by appropriately setting a thickness of the color conversion layer 40 (G, R).

Optionally, in an organic EL display device according to this embodiment of the invention, a color filter(s) that transmits light in a specific wavelength range can be provided at the side of light radiation of the resonant cavity color conversion EL element and the resonant cavity EL element. For example, blue, green and red color filters can be provided at the side of light radiation, e.g., at the side of the semi-transparent reflective layer 52 in the structure of FIG. 5, of the resonant cavity color conversion EL element or the resonant cavity EL element for blue color, green color, and red color subpixels. Provision of a color filter improves color purity of the radiated light from each pixel achieving high quality display. The color filter layer can be fabricated using a commercially available color filter material for flat panel display devices. The color filter layer can be formed by direct deposition on the semi-transparent reflective layer 52 or through a passivation layer, which can be formed of an inorganic oxide, such as $SiO_x$, $AlO_x$, $TiO_x$, $TaO_x$, or $ZnO_x$, an inorganic nitride, such as $SiN_x$, or inorganic oxinitride, such as $SiN_xO_y$. Alternatively, a color filter having a color filter layer on a separate transparent substrate apart from the substrate 10 can be stuck on the light radiating side of the organic EL display device and disposed to oppose the respective subpixel.

In the example of FIG. 5, a blue color subpixel is composed of a resonant cavity organic EL element and red color and green color subpixels are composed of resonant cavity color conversion organic EL elements. An organic EL display device of this embodiment of the invention can take a construction in which, for example, the blue color subpixel and the red color subpixel are composed of a resonant cavity EL element and the green color subpixel is composed of a resonant cavity color conversion EL element. Or, the blue color subpixel and the green color subpixel can be composed of a resonant cavity EL element and the red color subpixel then is composed of a resonant cavity color conversion EL element.

When plural types of subpixels are composed of resonant cavity organic EL elements, the resonant cavity organic EL element can be provided therein with a transparent layer (not illustrated in the figures) for adjusting the effective optical path length between the pair of reflective layers. When the blue color subpixel and the red color subpixel are composed of respective resonant cavity organic EL elements, for example, either one or both of the resonant cavity organic EL element for blue color subpixel and the resonant cavity organic EL element for red color subpixel are provided with a transparent layer to adjust the optical distance between the pair(s) of reflective layers. Useful materials for forming the transparent layer include inorganic oxides, such as $SiO_x$, $AlO_x$, $TiO_x$, $TaO_x$ or $ZnO_x$, inorganic nitrides, such as $SiN_x$, and inorganic oxinitride, such as $SiN_xO_y$. The transparent layer can be formed by means of any appropriate technique known in the art including a sputtering method, a CVD method and a vacuum evaporation method. The transparent layer can be located, for example, between an electrode (preferably a transparent electrode) and a semi-transparent reflective layer, that is, in the position of color conversion layer 40 shown in the structure of FIG. 5).

Plural types of subpixels can be formed without the transparent layer, and instead, by using a multi-mode resonant cavity organic EL element that increases intensity of emitted light in both blue color and red color wavelength regions. The optical path length of the resonant cavity organic EL element in this construction can be adjusted by varying the thicknesses of the functional layer 30 and the transparent electrode 22.

Figure 1B:
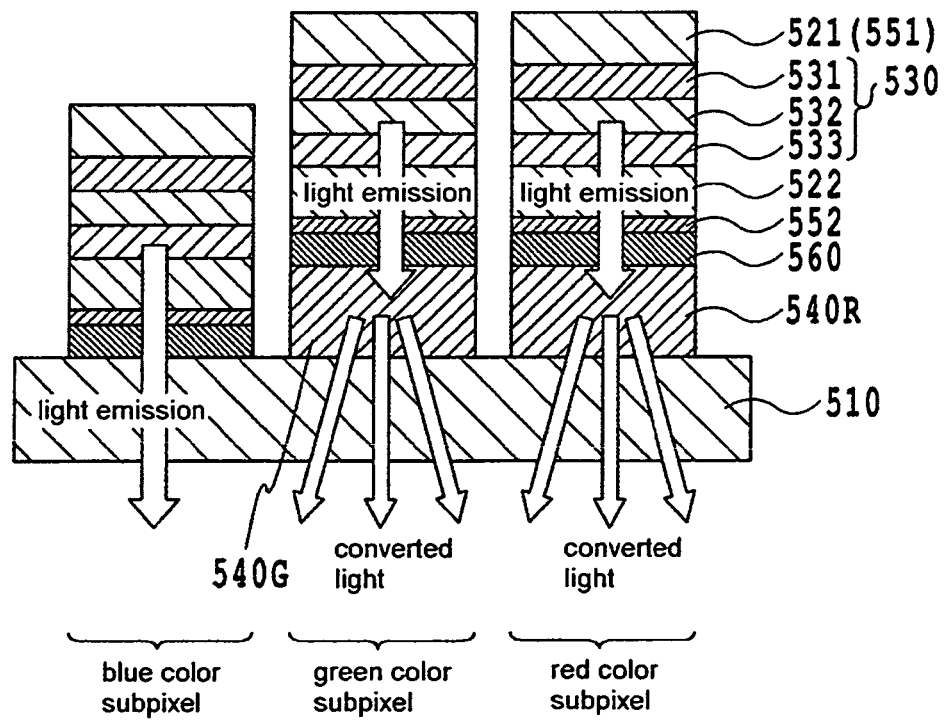

As described thus far, employment of a microcavity structure in every subpixel provides an organic EL display device without variation of hue that depends on viewing angle and exhibiting little viewing angle dependence. This is because in the display device of the invention as shown in FIG. 5, the light radiated from the color conversion layers in the red subpixel and green subpixel exhibits directivity by virtue of the microcavities, like in the blue subpixel, in contrast to a display device having a conventional structure such as is shown in FIG. 1(b), in which the light from the color conversion layers is radiated isotropically.

EXAMPLES

Example 1

Resonant Cavity Color Conversion EL Element Emitting Red Color Light

A substrate of Corning 1737 glass having dimensions of a length of 50 mm, a width of 50 mm, and a thickness of 0.7 mm was prepared, cleaned with alkali detergent, and rinsed thoroughly with deionized water. On the cleaned substrate, a silver alloy (APC-TR, a product of Furuya Metal Co., Ltd.) was deposited to form a 100 nm-thick silver alloy film by a DC magnetron sputtering method. On the silver alloy film, a film of photoresist (TFR-1250, a product of Tokyo Ohka Kogyo Co., Ltd.) having a thickness of 1.3 μm was spin-coated and dried in a clean oven at 80° C. for 15 min. On the photoresist film, ultraviolet light was irradiated by a high-pressure mercury vapor lamp through a photomask having a stripe pattern with a width of 2 mm. Being developed with a developer (NMD-3, a product of Tokyo Ohka Kogyo Co., Ltd.), a photoresist pattern with a width of 2 mm was created on the silver alloy thin film. After etching with an etchant for silver (SEA2, a product of Kanto Chemical Inc.), the photoresist pattern was stripped using a stripper (Stripper 106, a product of Tokyo Ohka Kogyo Co., Ltd.) to produce a metallic layer composed of stripes with a line width of 2 mm. On the metallic layer, a transparent conductive film of 100 nm thick indium zinc oxide (IZO) was deposited by a DC magnetron sputtering method; the transparent conductive film was patterned by the photolithography method as for the silver alloy thin film to form a transparent conductive layer composed of stripes that match to the pattern of the conductive layer; thus, a reflective electrode was obtained. Etching of IZO was carried out with oxalic acid. The substrate with the reflective electrode formed thereon was treated in a UV/$O_3$ cleaner equipped with a low pressure mercury vapor lamp at room temperature for 10 min.

The substrate after the cleaning treatment was installed in a vacuum thermal evaporator to form an organic EL layers. In the process of forming the organic EL layers, the pressure in the vacuum chamber was pumped down below $1\times10^{-4}$ Pa. First, $Alq_3$ and metallic lithium were co-evaporated with a molar ratio of 1 to 1 to form an electron injection layer having a film thickness of 20 nm. Then, $Alq_3$ was deposited to form an electron transport layer 10 nm thick. Then, a host material of ADN was co-evaporated with a light-emitting dopant 4,4'-bis(2-(4-(N,N-diphenylamino)phenyl)vinyl)biphenyl (DPAVBi) to form a light-emitting layer having a film thickness of 30 nm. The deposition speed of ADN was 1 Å/s and that of the DPAVBi was 0.03 Å/s. Then, NPB was deposited to form a 20 nm-thick hole transport layer. Finally, 2-TNATA and $F_4$-TCNQ were co-evaporated with a deposition speed that gives a film thickness ratio of 2-TNATA to $F_4$-TCNQ of 100:2 to obtain a hole injection layer with a film thickness of 30 nm.

The substrate having the organic EL layer formed thereon was transferred to an opposed target sputtering apparatus without breaking the vacuum, and IZO was deposited on the hole injection layer to form a transparent electrode with a film thickness of 50 nm. The metal mask used in the sputtering process had a stripe pattern with a width of 1 mm considering the pattern blur by the lateral spread of the sputtered particles. The obtained transparent electrode consisted of multiple stripes of electrode elements with a width of 2 mm extending in the direction perpendicular to the reflective electrode.

The substrate having the transparent electrode formed thereon was transferred again to the vacuum thermal evaporator without breaking the vacuum. On the transparent electrode, $Alq_3$ and DCM-2 were co-evaporated at a deposition speed that gives a thickness ratio of $Alq_3$ to DCM-2 equal to 100:3 to form a color conversion layer having a thickness of 320 nm. Subsequently, silver was deposited on the color conversion layer to form a 10 nm-thick semi-transparent reflective layer.

Then, the substrate having the semi-transparent reflective layer formed thereon was transferred into a plasma enhanced chemical vapor deposition (PECVD) apparatus using an enclosed transporter container keeping an environment with moisture concentration and oxygen concentration below 10 ppm. SiN was deposited on the semi-transparent reflective layer by PECVD method to form a encapsulation film with a film thickness of 1 μm.

Finally, a sealing glass substrate (OA-10, a product of Nippon Electric Glass Co., Ltd.) having dimensions of a length of 41 mm, a width of 41 mm and a thickness of 1.1 mm was prepared and a thermosetting epoxy adhesive was applied on the whole surface. The substrate with the adhesive was stuck on the encapsulation film to seal the organic EL light-emitting part. Thus, a resonant cavity color conversion EL element for red color light emission was obtained. In the structure of Example 1, the interface that exhibits largest difference in refractive index within the microcavity structure was the interface between the electron injection layer (lithium-doped $Alq_3$, refractive index 1.73 at 610 nm) and the transparent conductive layer (IZO, refractive index 2.01 at 610 nm), in which the difference in refractive index was 0.28.

Example 2

Resonant Cavity Color Conversion EL Element for Red Color Light Emission

A resonant cavity color conversion EL element for red color light emission was obtained in the same procedure as in Example 1 except that the thickness of the color conversion layer was changed to 330 nm and the thickness of the semi-transparent reflective layer was changed to 20 nm.

Comparative Example 1

Color Conversion EL Element for Red Color Light Emission

A color conversion EL element for red color light emission was obtained in the same procedure as in Example 1 except that any semi-transparent reflective layer was not formed.

Figure 6:
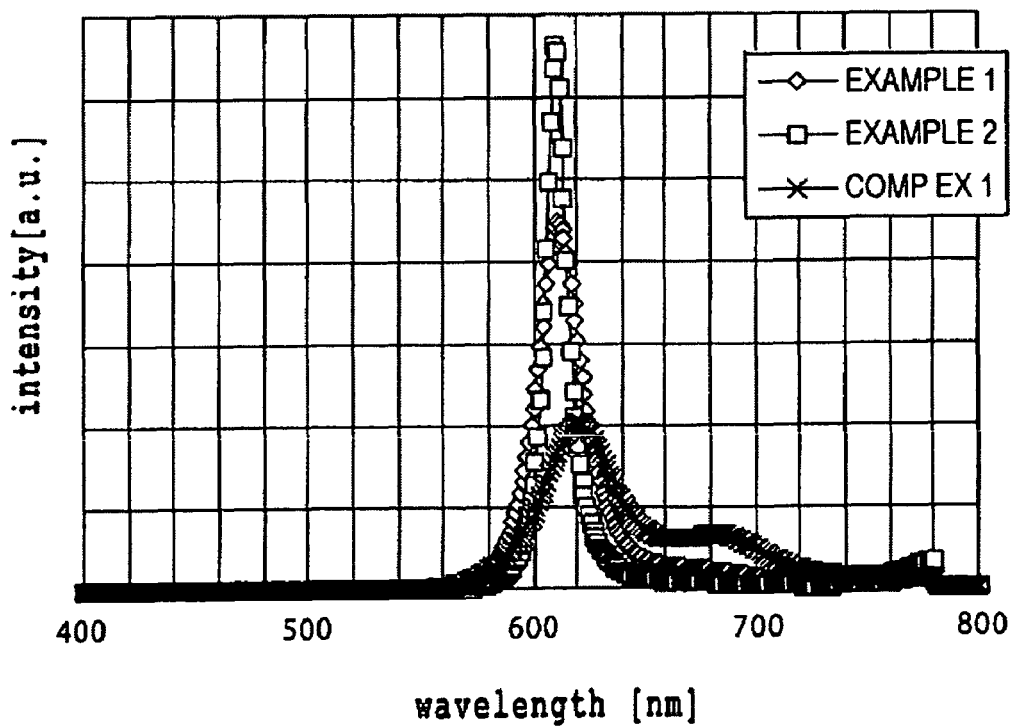
FIG. 6 is a graph showing emission spectra from EL elements of Example 1, Example 2, and Comparative Example 1.

FIG. 6 shows emission spectra of the elements produced in Examples 1 and 2, and Comparative Example 1. Table 1 shows evaluation results on chromaticity, current efficiency (at current density of 10 mA/cm$^2$), and luminance ratio (relative values to that of the element of Comparative Example 1) of the elements. As is apparent from FIG. 6 the peak intensity of the EL spectrum of Example 1 and 2 are much stronger than that of Comparative Example 1. Consequently the luminance efficiency of Examples 1 and 2 having a microcavity structure were enhanced by a factor of 1.7 and 1.4 respectively compared to Comparative Example 1.

TABLE 1

Evaluation of the elements of Examples 1 and 2, and Comparative Example 1

| | Chromaticity (CIE xy coordinate) | | Current efficiency | Luminance |
|---|---|---|---|---|
| | X | y | (cd/A) | ratio |
| Example 1 | 0.656 | 0.344 | 3.7 | 1.7 |
| Example 2 | 0.661 | 0.339 | 3.0 | 1.4 |
| Comp Ex 1 | 0.660 | 0.340 | 2.2 | 1 |

Example 3

Resonant Cavity Color Conversion EL Element for Green Color Light Emission

Figure 7:
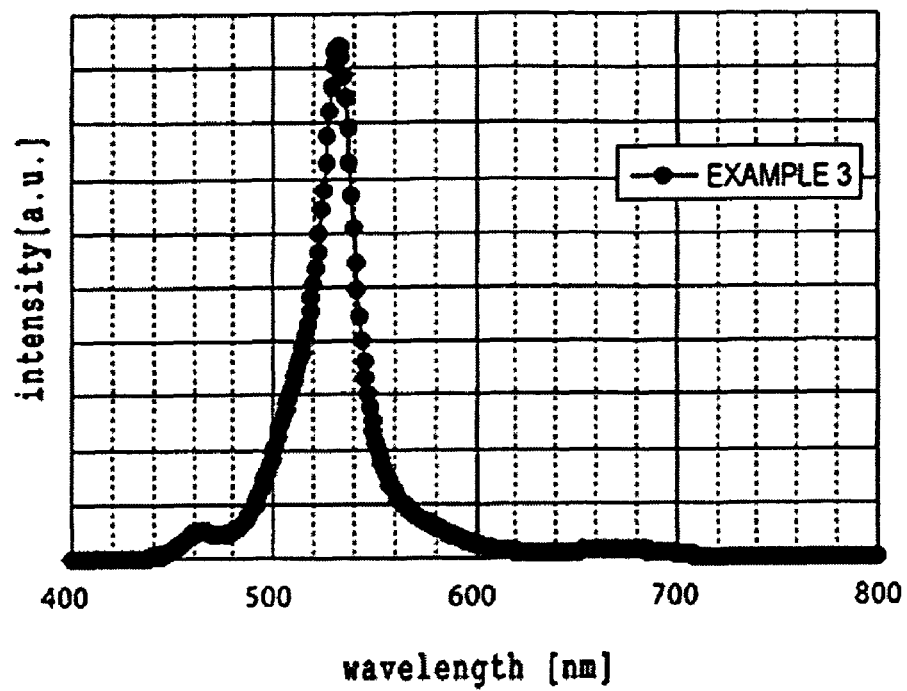
FIG. 7 is a graph showing an emission spectrum from the EL element of Example 3.

A resonant cavity color conversion EL element for green color light emission was obtained in the same procedure as in Example 1 except that a color conversion layer was formed by depositing solely $Alq_3$ and the thickness of the color conversion layer was changed to 230 nm. FIG. 7 shows an emission spectrum of the obtained element. Table 2 shows evaluation results on chromaticity and electric current efficiency (at a current density of 10 $mA/cm^2$). The results of FIG. 7 and Table 2 have demonstrated that introduction of a microcavity structure in the invention gives green color light with excellent color purity even by using $Alq_3$, which exhibits a broad emission spectrum as for a green color conversion dye. The interface that exhibited largest difference in refractive index within the microcavity structure in this Example 3 was also the interface between the electron injection layer (lithium-doped $Alq_3$, refractive index 1.73 at 530 nm) and the transparent conductive layer (IZO, refractive index 2.06 at 530 nm). The difference in refractive index was 0.33.

TABLE 2

Evaluation of the element of Example 3

| | Chromaticity (CIE xy coordinate) | | Current efficiency |
|---|---|---|---|
| | x | y | (cd/A) |
| Example 3 | 0.213 | 0.667 | 8.4 |

Example 4

Organic EL Display Device

This Example 4 provides an organic EL display device that has a schematic cross section shown in FIG. 5.

A substrate 10 was prepared, which was a non-alkaline glass substrate (Eagle 2000, a product of Corning Inc., with dimensions of length 50 mm, width 50 mm, and thickness 0.7 mm) having a plurality of switching elements (TFTs, not illustrated) arranged on the substrate surface for controlling subpixels. The TFT elements were fabricated using amorphous silicon. The switching elements were so arranged that 80 elements in the longitudinal direction with a pitch of 330 μm and 240 elements in the transverse direction with a pitch of 110 μm. This configuration corresponds to the arrangement of pixels consisting of RGB three subpixels aligning 80 pixels in transverse direction and 80 pixels in longitudinal direction. The switching elements were covered by a resin film (not illustrated) with a thickness of about 2 μm for flattening irregularities. The resin film has a plurality of contact holes for connecting the switching element to the light reflective electrode.

Similarly to Example 1, silver alloy (APC-TR, a product of Furuya Metal Co., Ltd.) was deposited on the resin film to a thickness of 100 nm by a DC magnetron sputtering method, and patterned matching to the contact hole positions on the resin film, obtaining a silver alloy pattern (a metallic layer) consisting of rectangular parts each having a length of 300 μm and a width of 95 μm with a pitch of 330 μm in the longitudinal direction and 110 μm in the transverse direction. Then, IZO was deposited to a thickness of 100 nm by a DC magnetron sputtering method and patterned matching to the silver alloy pattern, obtaining a pattern of transparent conductive layer consisting of rectangular parts each having a length of 310 μm and a width of 100 μm with a pitch of 330 μm in the longitudinal direction and 110 μm in the transverse direction. Thus, a reflective electrode 21 was obtained that has a lamination structure of silver alloy and transparent conductive layer and consists of plurality of electrode elements. This reflective electrode 21 also functions as a non-transparent reflective layer 51. Each of the electrode elements composing the reflective electrode 21 was connected to the switching element in a one-to-one corresponding manner.

Then, a photosensitive resin material (JEM-700-R2, a product of JSR Corporation) was applied on the substrate by a spin coating method so as to obtain a film 1 μm thick, which was then irradiated by the light from a high-pressure mercury vapor lamp through a photomask, followed by development using a developer (NMD-3, a product of Tokyo Ohka Kogyo Co. Ltd.). The resulted film was heated on a hot plate at 200° C. for 20 min to obtain an insulator film (not illustrated) having a plurality of openings each having a length of 300 μm and a width of 80 μm and positioned corresponding to each subpixel.

Then, the substrate having the insulator film formed thereon was installed in the vacuum thermal evaporator and a process for forming an organic EL layer 30 was conducted through a metal mask having openings at display areas (where the electrode elements for the reflective electrode 21 were formed). In the process for forming the organic EL layer 30, the pressure in the vacuum chamber was pumped down below $1\times10^{-4}$ Pa. First, $Alq_3$ and metallic lithium were co-evaporated in the molar ratio of 1:1 to form an electron injection layer 20 nm thick. Subsequently, $Alq_3$ was deposited to form an electron transport layer 10 nm thick. Subsequently, a host material of ADN and a light-emitting dopant of 4,4'-bis(2-(4-(N,N-diphenylamino)phenyl)vinyl)biphenyl (DPAVBi) were co-evaporated to form a light-emitting layer 32 having a thickness of 30 nm. Here, the deposition speed for ADN was 1 Å/s and that for DPAVBi was 0.03 Å/s. Subsequently, NPB was deposited to form a hole transport layer 20 nm thick. Finally, 2-TNATA and $F_4$-TCNQ were co-evaporated at a deposition speed that gives a ratio of film thicknesses of 2-TNATA to $F_4$-TCNQ equal to 100:2, to form a hole injection layer with a thickness of 60 nm. The lamination structure of the electron injection layer and the electron transport layer corresponds to the electron injection-transport layer 31, and the lamination structure of the hole transport layer and the hole injection layer corresponds to the hole injection-transport layer 33.

Then, the substrate having the organic EL layer 30 formed thereon was transferred into an opposed target sputtering apparatus without breaking the vacuum and IZO was deposited on the organic EL layer 30 through a metal mask having openings larger than those in the metal mask used for forming the organic EL layer 30 to form a transparent electrode 22 having a thickness of 50 nm. The transparent electrode 22 was a common electrode formed on the overall region of the display areas and includes portions to connect to connection terminals for connecting to an external driver circuit by virtue of the use of a metal mask having larger openings.

Then, the substrate having the transparent electrode 22 formed thereon was transferred again to the vacuum thermal evaporator without breaking the vacuum. A metal mask was prepared having a plurality of stripe-shaped openings extending in the longitudinal direction. The openings of the metal mask each having a width of 90 μm were arranged with a pitch of 330 μm. $Alq_3$ was deposited on the transparent electrode 22 through this metal mask, to form a green color conversion layer 40G with a thickness of 230 nm at the positions corresponding to green color subpixels.

Subsequently after shifting the position of the metal mask, Alq$_3$ and DCM-2 were co-evaporated through the metal mask at a deposition speed that gives a thickness ratio of Alq$_3$ to DCM-2 equal to 100:3, to form a red color conversion layer 40R with a thickness of 320 nm at the positions corresponding to red color subpixels.

After that, on the substrate having the green color conversion layer 40G and the red color conversion layer 40R formed thereon, silver was deposited through the metal mask that was used in the process of forming the transparent electrode 22, to form a semi-transparent reflective layer 52 with a thickness of 10 nm.

Subsequently, the substrate having the semi-transparent reflective layer formed thereon was transferred into a PECVD apparatus using an enclosed transporter container keeping an environment of moisture concentration and oxygen concentration within 10 ppm. SiN was deposited on the semi-transparent reflective layer by PECVD method to form a encapsulation film (not illustrated) with a film thickness of 1 μm. Thus, a substrate of EL device was obtained.

A glass substrate (OA-10, a product of Nippon Electric Glass Co., Ltd.) was prepared having dimensions of a length of 41 mm, a width of 41 mm, and a thickness of 1.1 mm. A color filter (not illustrated) was fabricated having color filter layers 0.8 μm thick of red, green and blue colors formed on the glass substrate at the positions corresponding to subpixels for respective colors. The filter layers were formed using the materials of Color Mosaic CR-7001 (red), CG-7001 (green), and CB-7001 (blue) (all available from Fujifilm Electronic Materials Co., Ltd.) and through a procedure comprising known steps of spin coating, patterning exposure, development, and thermal hardening. After applying a thermosetting epoxy adhesive on the whole surface region of the color filter layers, the color filter was stuck on the encapsulation film of the substrate of EL device to seal the organic EL light-emitting part. Thus, an organic EL display device was produced.

Regarding the red color subpixels and the green color subpixels in the display device of this Example 4, the interface that exhibits the largest difference in refractive index in the microcavity structure was, as described in Example 1 and Example 3, the interface between the electron injection layer and the transparent conductive layer; the difference in the refractive index was 0.28 for the red color subpixels and 0.33 for the green color subpixels. As for the blue color subpixels in the display device of this Example 4, the interface exhibiting the largest difference in refractive index in the microcavity structure was the interface between the electron injection layer (lithium-doped Alq$_3$, refractive index 1.80 at 470 nm) and the transparent conductive layer (IZO, refractive index 2.12 at 470 nm), and the difference in refractive index was 0.32.

Figure 8:
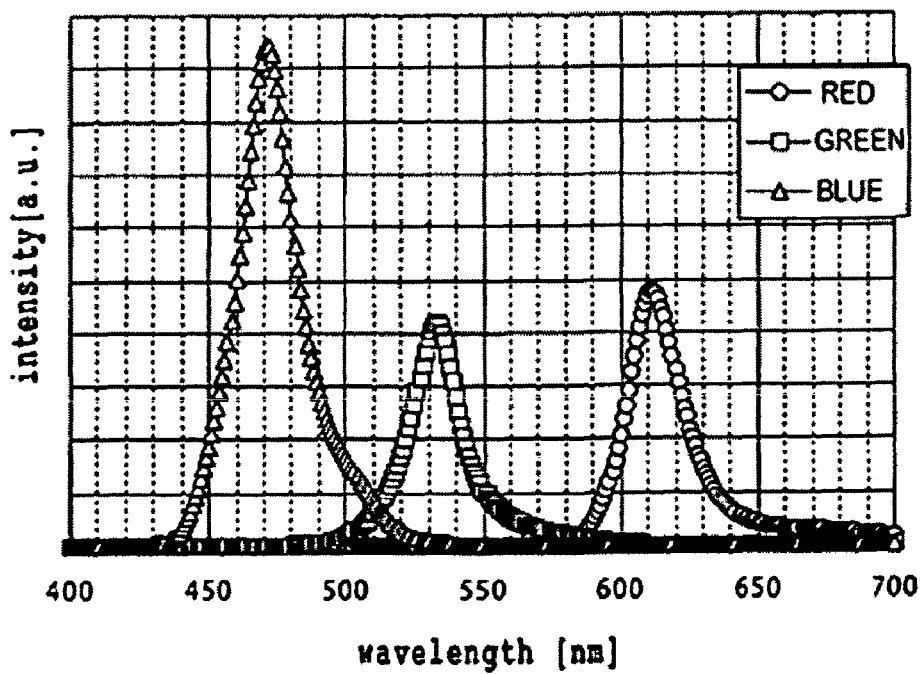
FIG. 8 is a graph showing emission spectra from subpixels for three colors of the display device of Example 4.

FIG. 8 shows emission spectra from three color types of subpixels of the produced organic EL display device. Table 3 shows chromaticity and luminance efficiency of the light emission from the three color types of subpixels operated at a current density of 10 mA/cm$^2$.

TABLE 3

Evaluation of the display device of Example 4

| | Chromaticity (CIE xy coordinate) | | Current efficiency |
|---|---|---|---|
| | x | y | (cd/A) |
| Blue color subpixel | 0.119 | 0.099 | 3.4 |
| Green color subpixel | 0.223 | 0.733 | 7.6 |
| Red color subpixel | 0.664 | 0.336 | 4.6 |

Comparison was made between observation on the display device from the direction normal to the display surface (at the viewing angle of 0°) and observation from an oblique direction with a viewing angle of 70° relative to the normal to the display surface. The difference in the color tone has been found little. This result was brought about by the similar microcavity structures in the red, blue, and green color subpixels which did not exhibit any angle dependence of light emission.

As described thus far, it has been demonstrated that organic EL elements of the invention in combination of a color conversion layer and a microcavity structure provides an organic EL display device that exhibits excellent color reproduction and high light emission efficiency.

While the invention has been described in conjunction with embodiments and variations thereof, one of ordinary skill, after reviewing the foregoing specification, will be able to effect various changes, substitutions of equivalents and other alterations without departing from the broad concepts disclosed herein. It is therefore intended that Letters Patent granted hereon be limited only by the definition contained in the appended claims and equivalents thereof.

What is claimed is:

1. A resonant cavity color conversion EL element, comprising:
    at least a pair of electrodes;
    a functional layer that includes a light-emitting layer and that is sandwiched by the pair of electrodes;
    a color conversion layer that absorbs light emitted from the light-emitting layer and emits light with a different wavelength; and
    a pair of light reflective layers,
    wherein the light-emitting layer and the color conversion layer are disposed between the pair of light reflective layers,
    wherein the pair of light reflective layers are composed of a non-transparent reflective layer and a semi-transparent reflective layer, and
    wherein the non-transparent reflective layer and the semi-transparent reflective layer have a distance therebetween that is set at an optical distance to construct a microcavity that increases intensity of light with a specific wavelength emitted from the color conversion layer.

2. The resonant cavity color conversion EL element according to claim 1, wherein the pair of electrodes is composed of a transparent electrode and a light reflective electrode, and wherein the light reflective electrode also functions as the non-transparent reflective layer.

3. The resonant cavity color conversion EL element according to claim 2, wherein the light reflective electrode is formed of a metal.

4. The resonant cavity color conversion EL element according to claim 3, wherein the metal is selected from the group consisting of elemental metals of Al, Ag, Mg, Zn, Ta, and alloys of these elemental metals.

5. The resonant cavity color conversion EL element according to claim 3, wherein the metal is an alloy composed of at least one element selected from the group consisting of Al, Ag, Mg, Zn, and Ta, and at least one element selected from the group consisting of Li, Na, K, Rb, Cs, and Ca.

6. The resonant cavity color conversion EL element according to claim 2, wherein the light reflective electrode has a laminated structure that includes a metal and a transparent conductive layer.

7. The resonant cavity color conversion EL element according to claim 6, wherein the metal is selected from the group consisting of elemental metals of Al, Ag, Mg, Zn, Ta, and alloys of these elemental metals.

8. The resonant cavity color conversion EL element according to claim 1, wherein the color conversion layer is disposed between the light-emitting layer and the semi-transparent reflective layer.

9. The resonant cavity color conversion EL element according to claim 1, wherein the semi-transparent reflective layer is a metallic film.

10. The resonant cavity color conversion EL element according to claim 9, wherein the metallic film composing the semi-transparent reflective layer is formed of a metal selected from the group consisting of Ag, Au, Cu, Mg, Li, and an alloy mainly composed of these elements.

11. The resonant cavity color conversion EL element according to claim 1, wherein, at every interface between adjacent layers that exist between the pair of light reflective layers, a difference in refractive index for a wavelength range of light emitted from the light-emitting layer is at most 0.35.

12. The resonant cavity color conversion EL element according to claim 1, wherein the color conversion layer is formed of solely one or more types of organic dyes.

13. An organic EL display device comprising:
the resonant cavity color conversion EL element defined by claim 1; and
a resonant cavity EL element comprised of:
at least a pair of electrodes;
a functional layer that includes a light-emitting layer that is sandwiched by the pair of electrodes; and
a pair of light reflective layers,
wherein the light-emitting layer is disposed between the pair of light reflective layers, and the pair of light reflective layers have a distance therebetween that is set at an optical distance to construct a microcavity that increases intensity of light with a specific wavelength emitted from the light-emitting layer; and
wherein a blue color subpixel, a green color subpixel, and a red color subpixel are composed of either the resonant cavity color conversion EL element or the resonant cavity EL element
wherein at least one of the blue color subpixel, the green color subpixel, and the red color subpixel is composed of the resonant cavity color conversion EL element.

14. The organic EL display device according to claim 13, wherein the blue color subpixel is composed of the resonant cavity EL element and the green color subpixel and the red color subpixel are composed of the resonant cavity color conversion EL element.

15. The organic EL display device according to claim 13, wherein the blue color subpixel and the red color subpixel are composed of the resonant cavity EL element and the green color subpixel is composed of the resonant cavity color conversion EL element.

16. The organic EL display device according to claim 13, wherein the blue color subpixel and the green color subpixel are composed of the resonant cavity EL element and the red color subpixel is composed of the resonant cavity color conversion EL element.

17. The organic EL display device according to claim 13, wherein one of the pair of electrodes is a transparent electrode, and wherein the color conversion layer is disposed between the transparent electrode and the semi-transparent reflective layer in the resonant cavity color conversion EL element.

18. The organic EL display device according to claim 13, further comprising a color filter layer for a color of each of the blue color subpixel, the green color subpixel, and the red color subpixel provided in a light-radiating side of (a) the resonant cavity color conversion EL element or (b) the resonant cavity EL element in each subpixel.

* * * * *